(12) United States Patent
Ryan

(10) Patent No.: US 6,410,435 B1
(45) Date of Patent: Jun. 25, 2002

(54) PROCESS FOR FABRICATING COPPER INTERCONNECT FOR ULSI INTEGRATED CIRCUITS

(75) Inventor: Vivian W. Ryan, Hampton, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/410,686

(22) Filed: Oct. 1, 1999

(51) Int. Cl.[7] .............................................. H01L 21/44
(52) U.S. Cl. ..................... 438/687; 438/633; 438/648; 438/656; 438/683; 438/685; 438/637
(58) Field of Search ................... 438/687, 648, 438/656, 683, 633, 637–640, 685, 691–692

(56) References Cited

U.S. PATENT DOCUMENTS

| 4,985,750 | A |   | 1/1991  | Hoshino ................... 357/71 |
| 5,272,376 | A |   | 12/1993 | Ueno ....................... 257/737 |
| 5,382,447 | A |   | 1/1995  | Kaja ...................... 427/126.6 |
| 5,674,787 | A |   | 10/1997 | Zhao ........................ 437/230 |
| 5,824,599 | A |   | 10/1998 | Schacham-Diamand .... 438/678 |
| 5,891,513 | A |   | 4/1999  | Dubin ........................ 427/98 |
| 5,898,222 | A |   | 4/1999  | Farooq ..................... 257/762 |
| 5,933,758 | A |   | 8/1999  | Jain .......................... 438/687 |
| 5,942,800 | A |   | 8/1999  | Yiu ........................... 257/754 |
| 6,083,835 | A | * | 7/2000  | Shue et al. ................. 438/687 |
| 6,107,185 | A | * | 8/2000  | Lukanc ..................... 438/631 |

* cited by examiner

Primary Examiner—Chandra Chaudhari
Assistant Examiner—Thanh Nguyen

(57) ABSTRACT

A method for manufacturing integrated circuits; particularly, a method for fabricating a copper interconnect system and a copper interconnect system, having a layer of CrO, fabricated by the method.

15 Claims, 2 Drawing Sheets

PROCESS FOR FABRICATING COPPER INTERCONNECT FOR ULSI INTEGRATED CIRCUITS

BACKGROUND OF THE INVENTION

1. Field of the Invention

This invention relates to a method of manufacturing semiconductor integrated circuit interconnect structures. The invention relates more particularly to a method for fabricating a copper interconnect system and a copper interconnect system, having a layer of CrO, or chromium oxide, fabricated by the method.

2. Background of the Invention

Semiconductor integrated circuit devices typically comprise silicon and multiple layers of vertically stacked metal interconnect layers with dielectric materials disposed between the metal layers. The fabrication of such devices typically involves the repeated deposition or growth, patterning, and etching of thin films of semiconductor, metal, and dielectric materials. Multiple metallization layers are employed to accommodate higher densities as device dimensions shrink to sub-micron levels and dielectric materials are utilized to separate the metallization, or conductive, regions. Contact openings are formed in the dielectric overlying a substrate region to provide conductive pathways to a source, drain and gate regions from a first metal layer. Via openings are formed in subsequent inter-level dielectric (ILD) layers separating various metal layers to provide conductive pathways between the metal layers.

A passivation layer is often deposited over a top metal layer as an insulation and protection layer to prevent mechanical and chemical damage during assembly and packaging. To deposit the passivation layer, the wafer surface may be backsputtered, if needed, and one or two layers of inorganic silicon oxide and/or silicon nitride and/or silicon oxynitride is deposited by chemical vapor deposition. The passivation layer typically has 4000 Å of silicon oxide and 3000 Å of silicon nitride, or 10000 Å of silicon oxide, where 4000 Å is etched back, and 3000 Å of silicon nitride. Other common passivation layers have a single coating of 3000 Å of silicon nitride. An organic spin-on dielectric, such as polyimide, is also sometimes used on top of the inorganic dielectric to form the passivation layer.

One common metal used for forming metal lines, or wiring, on a wafer is aluminum. Aluminum is relatively inexpensive, has a low resistivity, and is relatively easy to etch. Aluminum has also been used as a material for forming interconnections in vias to connect the different metal layers. However, as the size of the via, or contact holes, is decreased to sub-micron levels, a step coverage problem occurs, which has led to reliability problems when using aluminum to form the interconnection between different wiring layers. The poor step coverage in the sub-micron vias results in high current density and enhances electromigration, which is the transport of metal ions through conductors resulting from passage of direct electrical current.

Metals, such as tungsten, have been used to improve interconnection paths. Aluminum is used for the wiring, while tungsten plugs provide the interconnection between the different levels of wiring. However, the tungsten processes are complicated and expensive. Tungsten has a high resistivity, and tungsten plugs are susceptible to the presence of voids and form poor interface with the wiring layers, resulting in high contact resistance.

Copper is now being used for ULSI metallization because of its lower bulk electrical resistivity and its superior resistance to electromigration and stress voiding, as compared to commonly used aluminum and its alloys. Specifically, copper has a better electromigration property and lower resistivity than aluminum and better electrical properties than tungsten. Thus, copper is a desirable metal for use in wiring and plugs.

A typical semiconductor with copper metallization includes a copper metallization film directly deposited onto a patterned insulating film, such as $SiO_2$ film, which is deposited on a silicon substrate and over contact holes and trenches formed in an insulating film so as to be positioned on diffused layers formed in the silicon substrate. The copper film is then polished back to leave only copper in the trenches and contact holes in accordance with a wiring pattern and then annealed at a temperature of about 400° C. to grow grains of copper and improve electromigration resistance.

One of the problems with copper is that it is difficult to etch after deposition to form lines or via plugs. As a result, substantial time and expense is needed to etch copper. Chemical mechanical polishing has been used to polish away the unwanted copper material, but may be expensive and timely. Alternatively, copper may be selectively deposited within the vias to form plugs, which eliminates the polishing step. One technique to selectively deposit copper is electroless deposition, which requires activation of a surface to electrolessly deposit copper and is performed after placement of a barrier layer for isolation from an adjacent dielectric layer. The copper plug must also be encapsulated in the via.

Another major problem with copper is its fast diffusion in Si and drift in $SiO_2$-based dielectrics, resulting in the deterioration of devices at low temperatures. A reaction and interdiffusion between copper in the metallization film and Si included in the substrate, or copper in the metallization film and Si in the insulating film, may occur during annealing or other heat treating processes. This reaction or interdiffusion may occur because the copper metallization film is directly in contact with the Si substrate at the through holes in the insulating film and causes an increase in contact resistance and degradation of the copper metallization. Barrier failure is caused by diffusion of copper along grain boundaries or through defects generated at elevated temperatures in the barrier films, which are relatively intact, or by the reaction between barrier films and Si forming metal-rich silicides. Thus, it is necessary to prevent the reaction and interdiffusion between Cu and Si.

A semiconductor device that addresses the problem of reaction and interdiffusion is known. This device has a silicon substrate, an insulating film in which a contact hole is formed, a metallic layer deposited on the silicon substrate through the contact hole for forming an ohmic contact to the silicon substrate, a barrier layer deposited on the metallic layer for preventing reaction and an interconnection between copper and silicon, and a metallization film including copper deposited on the barrier layer.

Another semiconductor device is known to prevent oxidation of copper at wire bonding in a pad electrode using a thin film having anti-oxidation and anti-diffusion properties. This thin film is made of metallic material, such as Ti, W, Ta, or a compound of $Al_2O_3$, TiN, $TiSi_2$, and $WSi_2$. In general though, transition metals are not stable diffusion barriers between copper and silicon or between copper and wirebond metal or solder-bump metal. Adding Si to refractory materials, Ta, Mo, and W, to form an amorphous refractory metal-Si diffusion barrier improves barrier performance. A conductive metal-oxide diffusion barrier can survive thermal anneals up to between 500–600° C. Copper-oxide tends to form at the metal-oxygen/copper interface at higher temperatures.

Another problem associated with copper interconnect is degradation in bondability for bare die stored under normal conditions. The prior art addresses this problem by storing wafers under dry nitrogen or using organic-protective coating on bond pads, but this can be expensive.

Thus, it is desirable to have a method for fabricating copper interconnect that has an improved electromigration resistance, has better performance/reliability for wire bonds, enables conventional passivation layer processes to be used, and allows wafers to be stored for extended periods of time before assembly.

SUMMARY OF THE INVENTION

The invention is a method of manufacturing an integrated circuit including the steps of: (1) providing a wafer having an inter-level dielectric film and a barrier layer; (2) depositing a seed layer of copper on the barrier layer; (3) electroplating copper to a thickness sufficient to fill in any valleys in the inter-level dielectric film and cover an entire top surface of the wafer; (4) chemical mechanical polishing the top surface to remove i) any excess portions of copper caused by the electroplating and ii) selected portions of the inter-level dielectric film; (5) depositing a layer of CrO on the polished top surface to cover remaining portions of the copper; (6) depositing a passivation layer on the layer of CrO and portions of the inter-level dielectric film; and (7) etching the passivation layer to form a via that exposes a selected portion of the layer of CrO.

Another aspect of this invention is an integrated circuit comprising a wafer having a surface, a copper layer and an interlevel dielectric film formed on selected portions of the surface, a seed layer and a barrier layer formed between the copper layer and the inter-level dielectric film, a layer of CrO deposited substantially uniformly on top of the copper layer, a passivation layer covering any exposed portions of the copper layer and the inter-level dielectric film, and a via formed in the passivation layer exposing the layer CrO.

In yet another aspect of this invention is a method of manufacturing an integrated circuit including the steps of: (1) providing a wafer having bond pads comprised of a barrier layer, a seed layer formed thereon, and copper formed on said seed layer; (2) forming a layer of CrO on the copper; (3) forming a passivation layer on the layer of CrO; and (4) etching the passivation layer to form a via that exposes the layer of CrO.

In yet another aspect of this invention is an integrated circuit including a bond pad, having a barrier layer, a seed layer formed on the barrier layer, a copper layer formed on the seed layer, and a layer of CrO covering the copper layer, formed in an inter-level dielectric film; and a passivation layer formed on any exposed portion of the copper layer, the inter-level dielectric film, and a selected portion of the layer of CrO.

DETAILED DESCRIPTION

Figure 1:
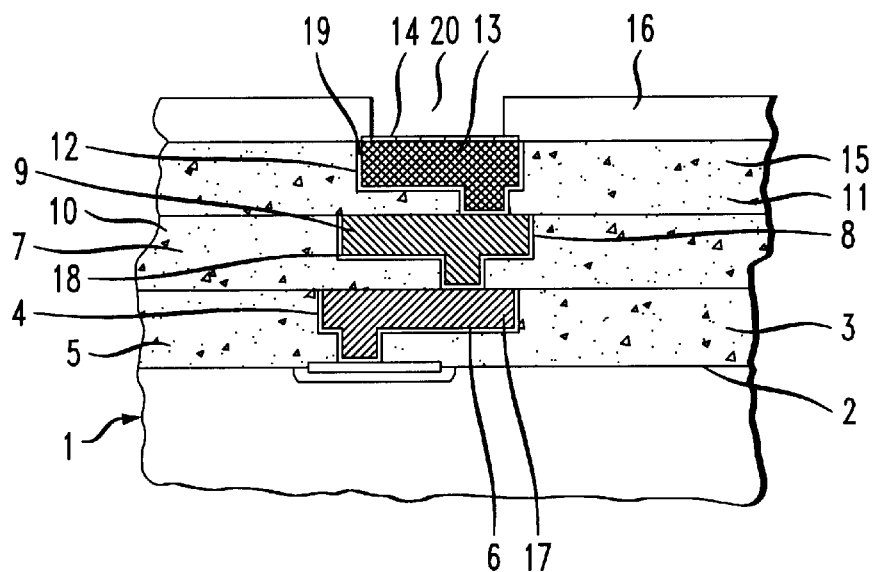
FIG. 1 is a cross-sectional view of a portion of a multi-level metallization integrated circuit manufactured in accordance with a first aspect of the invention.

The invention will be understood more fully from the detailed description given below, which however, should not be taken to limit the invention to a specific embodiment, but is for explanation and understanding only.

A first method of the invention is a method of manufacturing an integrated circuit including the steps of: (1) providing a wafer having an inter-level dielectric film and a barrier layer; (2) depositing a seed layer of copper on the barrier layer; (3) electroplating copper to a thickness sufficient to fill in any valleys in the inter-level dielectric film and cover an entire top surface of the wafer; (4) chemical mechanical polishing the top surface to remove i) any excess portions of copper caused by the electroplating and ii) selected portions of the inter-level dielectric film; (5) depositing a layer of CrO on the polished top surface to cover remaining portions of the copper; (6) depositing a passivation layer on the layer of CrO and portions of the inter-level dielectric film; and (7) etching the passivation layer to form a via that exposes a selected portion of the layer of CrO.

Preferably, the inter-level dielectric is an inorganic compound, such as silicon oxide, silicon nitride, silicon oxynitride, or mixtures thereof, or an organic compound. Particularly preferred is an inter-level dielectric layer having $SiO_2$. The barrier layer is preferably Ta, TaN, TiN, Ti, W, WN, TiSiN, TaSiN, or mixtures thereof.

The barrier layer may be backsputtered before the seed layer is deposited to improve adhesion of the seed layer. Sputtering is the preferred method to deposit the seed layer of copper, but it may also be deposited by chemical vapor deposition. After electroplating the copper, the chemical mechanical polishing removes any excess copper and the selected portions, such as the highest spots of the inter-level dielectric film, so that what remains are vias and/or trenches that are filled just to the top.

The layer of CrO may be deposited either by sputtering Cr in the presence of $O_2$ or by evaporating Cr in the presence of $O_2$. If these processes are utilized, then the CrO must be patterned using lithography to remove the CrO on the inter-level dielectric film. Alternatively, the layer of CrO may be deposited by autocatalytic plating. The resulting CrO layer covers the copper. In practice, an overhang head is likely to be used to completely cover all of the copper edges.

The preferred thickness of CrO depends on the mechanical properties of the layer of CrO, which in turn depends upon the particular process used to deposit the layer of CrO. The preferred thickness for common depositions is about 150–600 Å and particularly preferred is an optimum thickness of about 300Å. Chromium adheres well to copper, thus preventing electrotransport of copper at the top surface. In this invention, oxidation of the copper surface is prevented up to about 400° C. Copper oxide is detrimental because it greatly increases contact resistance and causes subsequent layers to have very poor adhesion.

The passivation layer may be silicon dioxide, silicon nitride, silicon oxynitride, doped versions of these materials, or mixtures thereof. Typical dopants are fluorine and boron. The passivation layer is preferably deposited by chemical vapor deposition, but may also be deposited by a spin-on dielectric glass or polymer process or a combination of these processes. The passivation layer is etched to form a via that exposes a selected portion of the CrO layer to either enable wire bonding, or solder bumping, to the top level of metal or to enable the next level of metal to contact the lower levels of metal. The selected portion exposed is dependent upon the area necessary for wire bondings, solder bumping, or deposition of the next level of metal.

A portion of a multi-level interconnect structure manufactured in accordance with the first method is shown in FIG. 1. The integrated circuit includes a wafer 1 having a surface 2 and three levels of metallization 5, 10, and 15. The first level 5 includes an inter-level dielectric layer 3 formed on the surface 2, a barrier layer 4 formed on the dielectric layer 3, a seed layer 6 formed on the barrier layer 4, and copper 17 formed on the seed layer 6. The second level 10 has an inter-level dielectric 7 formed on the first level 5, a barrier layer 8 formed on the dielectric layer 7, a seed layer 18 formed on the barrier layer 8, and copper 9 formed on the seed layer 18. The third level 15 has an inter-level dielectric layer 11 formed on the second level 10, a barrier layer 12 formed on the dielectric layer 11, a seed layer 19 formed on the barrier layer 12, and copper 13 formed on the seed layer 19. The third level also has a layer of CrO 14 formed uniformly in thickness on top of the copper 13. A via 20 is formed in the passivation layer 16 to expose a portion of the layer of CrO 14. A passivation layer 16 is formed on top of the third level 15 and covers portions of the dielectric layer 11 and may cover portions of the layer of CrO 14, seed layer 19, barrier layer 12, and copper 13. The interconnect structure may also have only one metal layer where the above-described third level of metallization is directly located on the surface of the wafer.

A second method of the invention is a method of manufacturing an integrated circuit including the steps of: (1) providing a wafer having bond pads comprised of a barrier layer, a seed layer formed thereon, and copper formed on the seed layer; (2) forming a layer of CrO on the copper, (3) forming a passivation layer on the layer of CrO; and (4) etching the passivation layer to form a via that exposes a selected portion of the layer of CrO. This method of the invention is used for bond pads on the top level, which in this case is copper. The bond pads are the features in the top-level metal used to connect a chip to the interconnect. Chromium provides a good glue layer for under-bump metal stack on bond pads for wire bond. The bond pads may also be used for solder bumps for flip chip packages.

Figure 2:
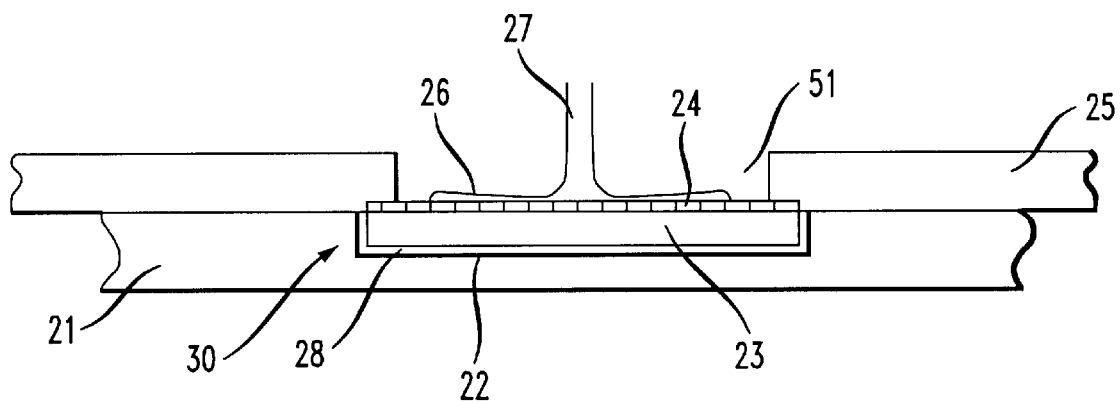
FIG. 2 is cross-sectional view of a portion of an integrated circuit manufactured in accordance with a second aspect of the invention.

A portion of an interconnect structure manufactured in accordance with the second method is shown in FIG. 2. inter-level dielectric layer 21 has been etched to form a trench in the shape of a bond pad. The bond pad 30, within inter-layer dielectric 21, includes a barrier layer 22, a seed layer 28 formed on the barrier layer 22, and a copper layer 23 formed on the seed layer 28. A layer of CrO 24 completely covers the copper layer 23 and a passivation layer 25 is formed on an exposed portion of the inter-level dielectric layer 21. A small portion of the passivation layer 25 usually covers a portion of the bond pad 30 to ensure a complete seal around the edges of the bond pad. A via 51 is formed in the passivation layer 25 to expose a portion of the layer of CrO 24. A wire bond is formed by a metal wire 27 and a ball-bond material 26. During the bonding process, once a bond is formed between ball-bond material 26 and the copper layer 23 and layer of CrO 24, the metal wire 27 is pulled away for making connection with a lead finger (not shown).

Figure 3:
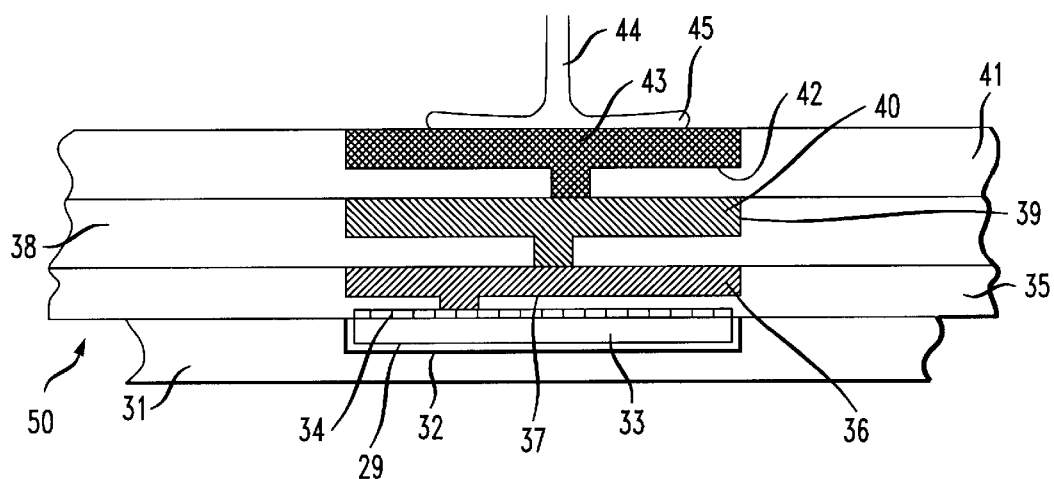
FIG. 3 is cross-sectional view of a portion of a multi-level metallization integrated circuit manufactured in accordance with the second aspect of the invention.

Another portion of an interconnect structure manufactured in accordance with the second method, as shown in FIG. 3, is a multi-level interconnect structure. This bond pad 50 is in a trench of inter-level dielectric layer 31, and includes a barrier layer 32 formed on a portion of the inter-level dielectric layer 31, a seed layer 29 formed on barrier layer 32, and a copper layer 33 formed on the seed layer 29. A layer of CrO 34 completely covers the copper layer 33 and a passivation layer 35 is formed on the layer of CrO 34 and portions of the inter-level dielectric layer 31. A barrier layer 37 is formed on the passivation layer 35, a metal layer 36 is formed on the barrier layer 37, and an inter-level dielectric film 38 is formed on the exposed metal layer 36 and dielectric layer 35. A barrier layer 39 is formed on the dielectric layer 38, a metal layer 40 is formed on the barrier layer 39 that contacts metal layer 36, and an inter-level dielectric film 41 is formed on the exposed metal layer 40 and dielectric layer 38. At the top of the bond pad 50, a barrier layer 42 is formed on the dielectric layer 41, and a metal layer 43 is formed on the barrier layer 42 that contacts metal layer 40. There may also be a seed layer (not shown) between the metal layers 36, 40, and 43 and passivation layers 35, 38, and 41, respectively. The metal wire 44 is bonded to the metal layer 43 by ball-bond material 45. These additional metal layers above the layer of CrO in the bond pad could be used to construct a bond pad also containing aluminum. As a result, the second method could be used for various wire bonding techniques, such as gold-wire bonding to aluminum used during assembly and packaging.

One or more of the above steps may be repeated any number of times.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents. For example, the number of metallization layers may vary.

What is claimed is:

1. A method of manufacturing an integrated circuit comprising:
   a. providing a wafer having an inter-level dielectric film and a barrier layer;
   b. depositing a seed layer of copper on said barrier layer;
   c. electroplating copper to a thickness sufficient to fill any valleys in said inter-level dielectric film and cover an entire top surface of said wafer;
   d. chemical mechanical polishing said top surface to remove i) any excess portions of copper caused by said electroplating and ii) selected portions of said inter-level dielectric film;
   e. depositing a layer of CrO on said polished top surface to cover remaining portions of said copper;
   f. depositing a passivation layer on said layer of CrO and portions of said inter-level dielectric film; and
   g. etching said passivation layer to form a via that exposes a selected portion of said layer of CrO.

2. The method of claim 1 wherein said inter-level dielectric film comprises at least one layer of an inorganic compound selected from the group consisting of silicon oxide, silicon nitride, silicon oxynitride, and mixtures thereof.

3. The method of claim 1 wherein said inter-level dielectric film is $SiO_2$.

4. The method of claim 1 wherein said inter-level dielectric film comprises at least one layer of an organic compound.

5. The method of claim 1 wherein said barrier layer comprises a material selected from the group consisting of Ta, TaN, TiN, Ti, W, WN, TiSiN, TaSiN, or mixtures thereof.

6. The method of claim 1 wherein said layer of CrO has a thickness of about 150–600 Å.

7. The method of claim 1 wherein said layer of CrO has a thickness of about 300 Å.

8. The method of claim 1 wherein said layer of CrO is formed by sputtering Cr in the presence of $O_2$ and said layer of CrO is patterned using lithography after said layer of CrO is deposited.

9. The method of claim 1 wherein said layer of CrO is formed by evaporating Cr in the presence of $O_2$ and said layer of CrO is patterned using lithography after said layer of CrO is deposited.

10. The method of claim 1 wherein said layer of CrO is formed by autocatalytic plating Cr in the presence of $O_2$.

11. The method of claim 1 wherein said barrier layer is backsputtered before said seed layer is formed to improve adhesion.

12. The method of claim 1 wherein said seed layer is formed by sputtering.

13. The method of claim 1 wherein said seed layer is formed by chemical vapor deposition.

14. The method of claim 1 wherein said passivation layer is comprised of a compound selected from the group consisting of silicon dioxide, silicon nitride, silicon oxynitride, doped silicon dioxide, doped silicon nitride, doped silicon oxynitride, and mixtures thereof.

15. The method of claim 1 wherein said passivation layer is formed by a process selected from the group consisting of chemical vapor deposition, spin-on dielectric glass, spin-on dielectric polymer, and combinations thereof.

* * * * *